United States Patent
DiVergilio et al.

(10) Patent No.: US 7,748,344 B2
(45) Date of Patent: Jul. 6, 2010

(54) SEGMENTED RESONANT ANTENNA FOR RADIO FREQUENCY INDUCTIVELY COUPLED PLASMAS

(75) Inventors: William F. DiVergilio, Beverly, MA (US); Victor M. Benveniste, Gloucester, MA (US); Peter L. Kellerman, Essex, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 1260 days.

(21) Appl. No.: 10/702,368

(22) Filed: Nov. 6, 2003

(65) Prior Publication Data

US 2005/0098117 A1    May 12, 2005

(51) Int. Cl.
  C23C 16/452   (2006.01)
  C23C 16/507   (2006.01)
  C23C 16/509   (2006.01)
  C23C 16/517   (2006.01)
  C23C 16/505   (2006.01)
  C23F 1/00     (2006.01)
  H01L 21/306   (2006.01)
  C23C 16/06    (2006.01)
  C23C 16/22    (2006.01)

(52) U.S. Cl. .............. 118/723 IR; 118/723 I; 118/723 ER; 118/723 E; 156/345.35; 156/345.39; 156/345.45; 156/345.48

(58) Field of Classification Search ........... 118/723 AN, 118/723 I, 723 ER, 723 E, 723 IR; 156/345.39, 156/345.44, 345.45, 345.48, 348.49, 345.35
See application file for complete search history.

(56) References Cited

U.S. PATENT DOCUMENTS

| | | | |
|---|---|---|---|
| 3,908,183 A | 9/1975 | Ennis, Jr. | |
| 3,961,103 A | 6/1976 | Aisenberg | |
| 4,698,236 A | 10/1987 | Kellogg et al. | |
| 4,963,735 A | 10/1990 | Okamoto et al. | |

(Continued)

FOREIGN PATENT DOCUMENTS

GB    2 308 745    *    2/1997

(Continued)

OTHER PUBLICATIONS

"The ULE2 Ion Source Capabilities Important to SOI Technology", Michael A. Graf, Wade Krull and Victor Benveniste, Eaton Corporation. Beverly, MA 01915. No date available, 4 pgs.

*Primary Examiner*—Rudy Zerigon
(74) *Attorney, Agent, or Firm*—Eschweiler & Associates, LLC

(57) ABSTRACT

An ion shower system is disclosed and comprises a plasma source operable to generate source gas ions within a chamber. The plasma source further comprises a plurality of conductor segments and a plurality of capacitors, wherein the conductor segments are serially connected through the plurality of capacitors. The plasma source further comprises an antenna drive circuit coupled to the plurality of conductor segments that provides power to the conductor segments and capacitors at a predetermined frequency. The ion shower system also comprises a source gas inlet that provides a source gas to the chamber. The conductor segments, capacitors and antenna drive circuit cooperatively provide energy to charged particles in the chamber, thereby energizing the charged particles and generating a plasma comprising source gas ions and electrons within the chamber due to ionizing collisions between the energized charged particles and the source gas.

12 Claims, 10 Drawing Sheets

U.S. PATENT DOCUMENTS

| | | | |
|---|---|---|---|
| 4,987,346 A | 1/1991 | Katzschner et al. | |
| 5,036,252 A | 7/1991 | Löb | |
| 5,053,627 A | 10/1991 | Ruffell et al. | |
| 5,218,210 A * | 6/1993 | McIntyre et al. | 250/492.2 |
| 5,563,418 A | 10/1996 | Leung | |
| 5,846,883 A * | 12/1998 | Moslehi | 438/711 |
| 6,197,166 B1 | 3/2001 | Moslehi | |
| 6,248,642 B1 | 6/2001 | Dolan et al. | |
| 6,305,316 B1 | 10/2001 | DiVergilio et al. | |
| 6,488,807 B1 * | 12/2002 | Collins et al. | 156/345.49 |
| 6,504,159 B1 | 1/2003 | Keller | |
| 6,511,577 B1 | 1/2003 | Johnson | |
| 6,552,295 B2 * | 4/2003 | Markunas et al. | 219/121.36 |
| 6,572,732 B2 | 6/2003 | Collins | |
| 6,623,596 B1 | 9/2003 | Collins et al. | |
| 6,716,727 B2 | 4/2004 | Walther | |
| 6,768,120 B2 * | 7/2004 | Leung et al. | 250/423 R |
| 6,841,789 B2 | 1/2005 | Koh et al. | |
| 6,888,146 B1 * | 5/2005 | Leung et al. | 250/398 |
| 6,936,144 B2 * | 8/2005 | Weiler et al. | 204/298.06 |
| 7,064,049 B2 | 6/2006 | Ito et al. | |
| 2001/0047760 A1 * | 12/2001 | Moslehi | 118/723.1 |
| 2002/0022344 A1 | 2/2002 | Kang et al. | |
| 2002/0098713 A1 | 7/2002 | Henley et al. | |
| 2002/0189763 A1 | 12/2002 | Kwon et al. | |
| 2003/0197129 A1 | 10/2003 | Murrell et al. | |
| 2005/0016462 A1 | 1/2005 | Yamazaki | |

FOREIGN PATENT DOCUMENTS

WO     WO 0163981 A * 8/2001

* cited by examiner

SEGMENTED RESONANT ANTENNA FOR RADIO FREQUENCY INDUCTIVELY COUPLED PLASMAS

FIELD OF THE INVENTION

The present invention relates generally to ion shower systems, and more particularly to a system and method for performing SIMOX type implantation using an ion shower system.

BACKGROUND OF THE INVENTION

Silicon-on-insulator (SOI) technology offers particular advantages in the fabrication of certain integrated circuit (IC) devices, as well as in other applications. Among these advantages is higher performance over conventional devices, reduced power consumption, improved radiation immunity, smaller die size, and process simplification. Tools that facilitate the economical production of high quality starting material, or wafers, to the SOI community can help drive the technology to greater acceptance.

Several different techniques presently exist to form SOI type wafers. One conventional process employs the implantation of hydrogen into the wafer to assist in fracturing a wafer assembly comprising a wafer with a surface-deposited oxide layer bonded to another silicon wafer. The implanted hydrogen preferentially allows the assembly to fracture along a plane parallel to the oxide surface, resulting in a thin surface silicon-on-oxide sandwich on a silicon substrate.

Another conventional technique employed to form SOI wafers is a technique called "separation by implanted oxygen" (SIMOX). In the SIMOX process, a thin layer (e.g., about 1,000-3,000 Angstroms) of a monocrystalline substrate is separated from the bulk of the substrate by implanting oxygen ions into the wafer to form a buried dielectric layer (BOX). Such implantation conventionally is performed with an implantation dose of about $1\times10^{18}$ to about $3\times10^{18}$ oxygen ions/cm$^2$, and the resultant buried dielectric layer ranged in thickness from about 1,000-5,000 Angstroms. The SIMOX process thus results in a heterostructure in which a buried silicon dioxide layer serves as an effective insulator for surface layer electronic devices.

Traditional SIMOX processing employs an ion implantation system, wherein a pencil-shaped beam or a ribbon-shaped beam is generated, mass analyzed and directed toward an end station. The end station is a batch-type end station, wherein a plurality of workpieces or wafers reside and spin about an axis. In pencil-type beams 10, wherein the beam width is substantially smaller than the size of the wafer 12, a magnetic scanner apparatus is employed to radially scan the beam with respect to the endstation, such that as the wafers spin 14 about the axis, the oxygen ion beam scans 16 across each of the wafers, as illustrated in prior art FIG. 1A. The above solution requires a scanning mechanism and associated controller. In addition, as can be seen in prior art FIG. 1B, however, such a scanning process is not trivial; rather since some portions of the beam will be traversed twice per full scan, while other portions are scanned only once, a moderately sophisticated scan and rotation control architecture must be controlled to emulate a typically desirable Lissajou pattern.

When employing a ribbon-shaped beam 20 as illustrated in FIGS. 2A and 2B, 20 the width 22 of the beam is typically larger than the diameter 24 of the wafer 12, and thus many of the above challenges associated with the above conventional scanning process are avoided. Use of a ribbon-beam 20, however, has challenges with respect to wafer cooling. Typically, a SIMOX process is controlled modestly stringently at about 600 C such that the implantation self-anneals to repair the lattice of the wafer. Thus challenges exist to balance the beam power with radiative cooling that is employed as the wafer spins about the axis. In addition, although the ribbon-beam does not have to scan across the wafer, since the wafers are off-axis the current density seen by portions of the wafer further away from the axis decreases by 1/r, wherein r is the distance from the axis to the portion of the wafer at issue. Thus, non-uniform implantation and thermal effects may occur unless additional control is employed. Varying the current density of the ribbon-beam along its width to accommodate for the above variation is rather challenging and requires further system complexities.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention is directed to an ion shower system for use in implantation of ions into a workpiece. The system is particularly advantageous for use in SIMOX applications, wherein a high oxygen fraction and high beam current uniformity is desired.

According to one aspect of the present invention, the ion shower system comprises a plasma source associated with a chamber. The system further comprises a workpiece support structure associated with a top portion of the chamber, wherein the workpiece support structure is operable to secure a workpiece such as a 300 mm silicon wafer. The support structure secures the workpiece such that an implantation surface thereof is oriented downward toward the extraction assembly. The plasma source receives an input source gas (e.g., oxygen) and generates a plasma using, for example, RF power. The source and/or chamber are configured such that the generated plasma is azimuthally symmetric within the chamber. The extraction assembly is operable to extract the uniform plasma vertically toward the secured workpiece for implantation thereof. The upside-down design advantageously facilitates reduced contamination since any contaminants suspended within the plasma fall away from the workpiece upon a deactivation of the plasma. The configuration also advantageously facilitates use of evaporative cooling of the workpiece by configuring an evaporative cooling structure on a top portion of the workpiece support structure, wherein such cooling can be provided in a spatially uniform manner across the workpiece.

In accordance with another aspect of the present invention, the ion shower system comprises a chamber having at least two grounding rods therein. The chamber walls are preferably coated with silicon to reduce contamination, however, when oxygen is the source gas, the oxygen reacts with the silicon chamber sidewalls, causing the walls to oxidize and become an insulator. Thus the grounding rods in the chamber serve to collect excess electrons during ion extraction. The grounding rods are silicon coated and while one is biased to a ground potential, the other is biased negative such that ions in the chamber sputter off any oxide that has formed on the grounding rod. The ground potential and negative potential are then switched back and forth between the rods to maintain a path for excess electrons while preventing the rods from unduly oxidizing.

According to still another aspect of the present invention, the ion shower chamber comprises a radial confinement system operable to radially confine the plasma within the chamber. The confinement system, in one example, comprises a magnetic device that generates multi-cusp magnetic fields that serve to prevent the plasma from reaching the chamber sidewalls. In one example, the magnetic device comprises a plurality of independently drivable coils that permit the strength of resulting multi-cusp magnetic fields to be individually controlled for tuning. The confinement system aids in the generation and maintenance of azimuthally symmetric plasma within the chamber, which advantageously facilitates uniform beam current at the workpiece.

According to yet another aspect of the present invention, the ion shower system comprises an extraction assembly that comprises a multi-electrode arrangement. A first electrode, a plasma electrode, is associated with the chamber and is biased at the same potential as the plasma. The plasma electrode has a plurality of extraction apertures within an extraction region, however, due to the high-density plasma within the chamber, the plasma electrode may have a transparency of as low as 10%. A second electrode, an extraction electrode, is biased negatively with respect to the plasma electrode to form an electrostatic field therebetween and extract positive ions from the chamber. The extraction electrode has a plurality of extraction apertures associated therewith that are aligned substantially with respect to the extraction apertures in the plasma electrode. The extraction electrode further comprises a plurality of interstitial pumping apertures that serve to pump excess neutral source gas therethrough and substantially reduce a pressure associated with the extraction assembly. The reduced pressure improves system reliability by reducing discharges within the chamber due to increased pressure.

The pattern of extraction electrodes may be spatially uniform or alternatively may vary to provide compensation for any plasma non-uniformities. For example, if the plasma density within the chamber decreases slightly azimuthally (about the periphery of the chamber), the extraction aperture density can be increased peripherally to provide compensation, thereby further improving beam current uniformity at the workpiece.

According to still another aspect of the present invention, the ion shower system comprises an RF antenna system for generating a plasma within the system chamber. A neutral source gas, for example, oxygen, is injected into the chamber. The RF antenna system produces RF electric fields that excite charged particles in the chamber that cause a plasma to be generated due to collisions of the accelerated charged particles with the neutral source gas atoms. The antenna system comprises a plurality of conductive loop antenna segments serially coupled together through capacitors. The arrangement reduces an undesirable non-uniform capacitive field component by a factor of N, wherein N is the number of conductive loop antenna segments. The reduction in the capacitive field components advantageously facilitates an improvement in plasma uniformity within the chamber. The plurality of conductive loop segments preferably are configured in an azimuthally symmetric arrangement such that, to the extent that any non-uniformity exists for each segment, such non-uniformity is itself azimuthally symmetric within the chamber.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1A:
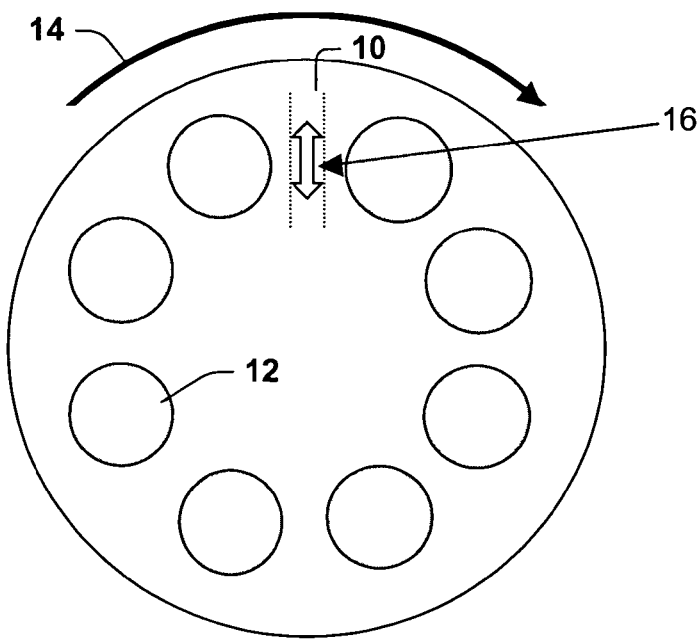
FIG. 1A is a plan view diagram illustrating a convention endstation and a scanning mechanism for implanting ions into a plurality of workpieces using a pencil-type beam.
Figure 1B:
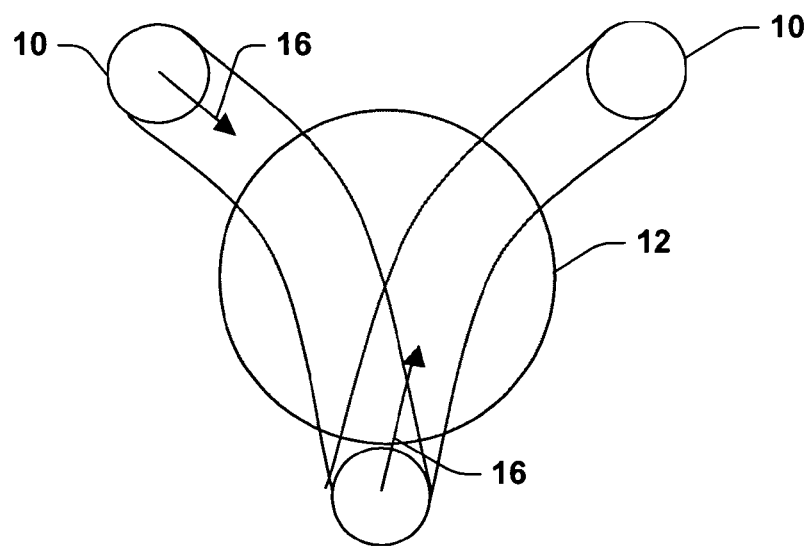
FIG. 1B is a plan view diagram illustrating in greater detail the conventional scanning of a wafer of FIG. 1A, wherein a scanning path results in portions receiving differing doping concentrations.
Figure 2A:
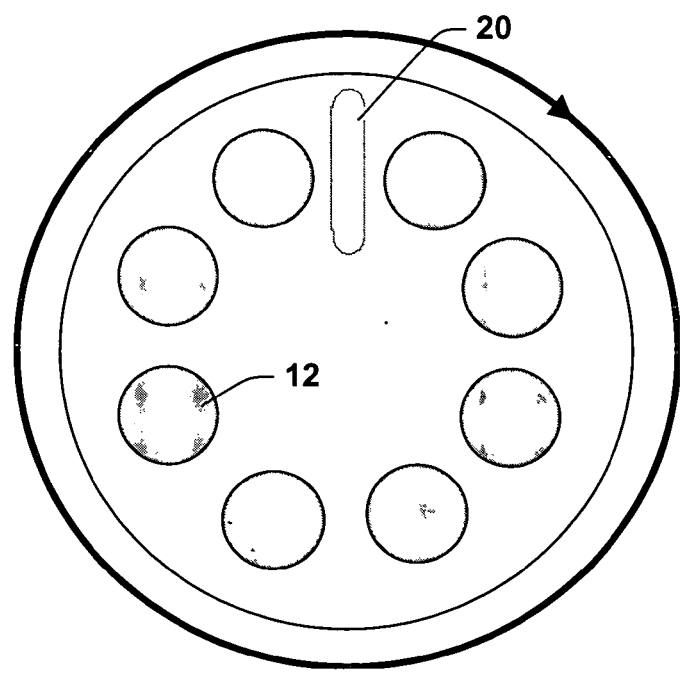
FIGS. 2A-2B are plan view diagrams illustrating a conventional endstation and a scanning mechanism using a ribbon-type ion beam.
Figure 2B:
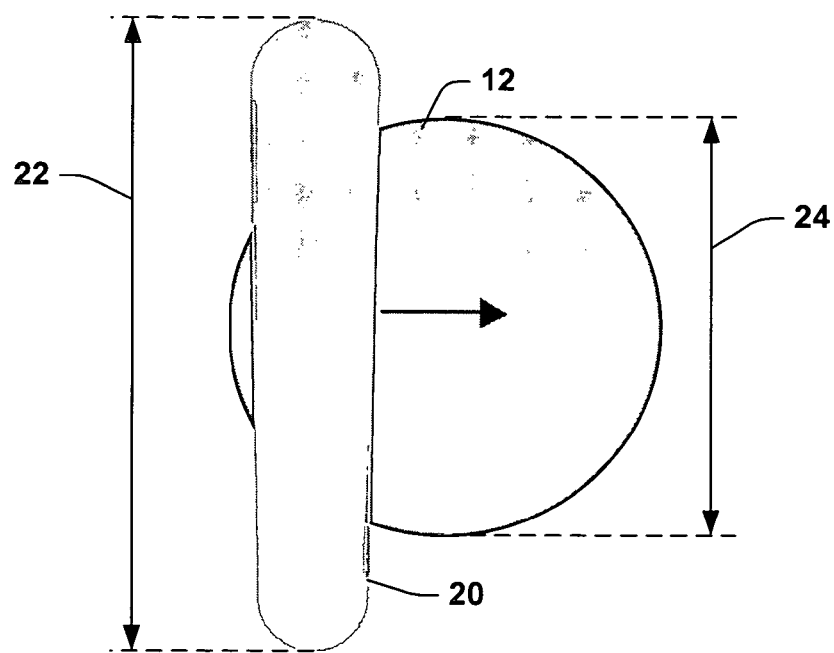

The present invention will now be described with reference to the drawings wherein like reference numerals are used to refer to like elements throughout. The illustrations and following descriptions are exemplary in nature, and not limiting. Thus, it will be appreciated that variants of the illustrated systems and methods and other such implementations apart from those illustrated herein are deemed as falling within the scope of the present invention and the appended claims. The present invention pertains to an ion shower system for use in implantation of ions into a workpiece. The present invention may find particular application in the implantation of oxygen ions, for example, in a SIMOX type process to form SOI wafers for use in semiconductor processing. Other applications, however, may be available and are contemplated as falling within the scope of the present invention.

Figure 3:
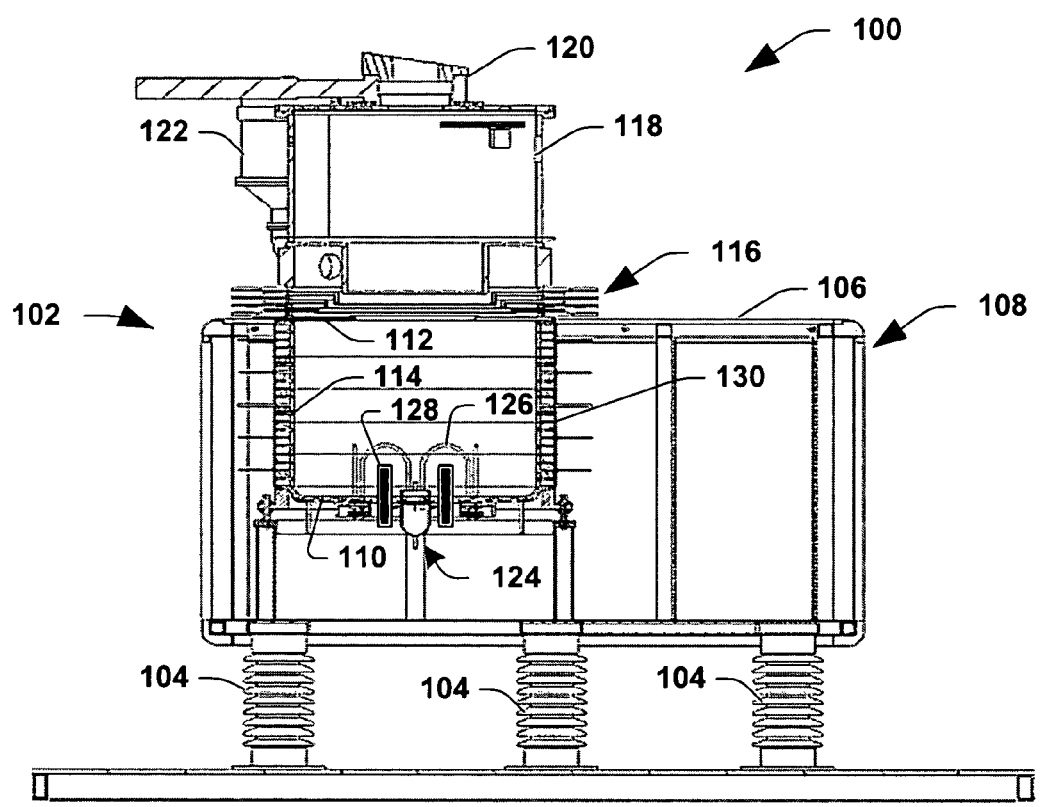
FIG. 3 is a side elevation view of an ion shower system in accordance with one or more aspects of the present invention.

Turning now to the figures, FIG. 3 illustrates an ion shower system 100 in accordance with one aspect of the present invention. The ion shower system 100 comprises a chamber 102 supported by a plurality of support structures 104. The chamber 102 may reside within a cabinet enclosure 106, a portion 108 of which may house a feed gas (not shown) such as oxygen, one or more power supplies (not shown), as well as other components as needed.

The chamber 102 has a bottom portion 110, a top portion 112 and side portions 114, respectively. In one example, the side portions 114 comprise a cylinder, thereby making the chamber radially or azimuthally symmetric. An extraction assembly 116 is associated with the top portion 112 of the chamber 102, and couples a process chamber 118 containing a workpiece (not shown) therein. The workpiece is secure within the process chamber 118 with a clamping system 120, such as an electrostatic clamp, however, other mechanisms may be employed and are contemplated as falling within the scope of the present invention. As will be discussed in greater detail infra, the process chamber 118 may further include a pump 122 for removal of neutral gas from the process chamber to maintain a desired pressure environment.

The chamber 102 further comprises an inlet gas port 124, and in the present example, the port is associated with the bottom 110 thereof. Also associated with the bottom portion 110 of the chamber 102 is an antenna system 126 comprising multiple single loop antennas coupled together. As will be discussed in greater detail below, the antenna system 126 is coupled to an RF source (not shown) and provides RF excitation for plasma generation within the chamber, wherein the excitation is azimuthally symmetric. Such excitation facilitates plasma uniformity within the chamber 102 that advantageously facilitates beam current uniformity at the workpiece.

The chamber 102 further comprises a grounding system 128, for example, a plurality of grounding rods that operate to collect electrons while ions are extracted from the chamber in order to maintain plasma stability. Further, the chamber 102 further comprises a plasma confinement system 130 associated with at least the side portions 114 of the chamber. In one example, the plasma confinement system 130 comprises a plurality of multi-cusp magnets that generate multi-cusp magnetic fields that extend into the chamber. The multi-cusp magnetic fields operate to confine the plasma radially and aid in further facilitating azimuthal plasma symmetry within the chamber 102.

According to one aspect of the invention, the ion shower system 100 has an upside-down design, wherein the extraction assembly 116 and workpiece are associated with the top portion 112 of the chamber 102. In the above manner, the generated ions within the chamber 102 are extracted vertically upwards via the extraction assembly 116 and with the workpiece oriented facing down, the ions are implanted therein. Such an arrangement advantageously provides a reduction in contamination at the workpiece. For example, any contaminants suspended in the plasma will fall to the bottom portion 110 of the chamber 110 upon deactivation of the plasma due to the influence of gravity. Thus upon deactivation, any contaminants fall away from the workpiece as opposed to falling towards the workpiece in a conventional system wherein the workpiece is situated below the chamber. Further, the vertical orientation of the system 100 advantageously aids in beam uniformity at the wafer. For example, one factor in achieving beam uniformity is the alignment and focus of beamlets through the extraction assembly 116. The vertical orientation highlighted above allows the extraction electrodes to also be vertically oriented, and such orientation avoids or reduces cantilevering forces that may negatively impact alignment when assembling or maintaining the system.

Another advantageous feature associated with the upside-down design is the configuration facilitates use of an evaporative cooling unit (not shown) in association with the clamping system 120. Due to the high beam current, cooling the workpiece is an important feature. Evaporative cooling is more effective than mere convective cooling, and with the upside-down design, an evaporative cooling system may reside on top of the clamping system 120 (e.g., an electrostatic clamp). For example, water may be employed as the cooling medium and overlay the entire workpiece portion of the clamping system 120. As the water heats up and boils, steam escapes and energy is dissipated uniformly about the workpiece. Such a mechanism would not operate in the same uniform manner if the process chamber 118 was oriented to the chamber 102 in another manner.

The chamber 102 is a large volume chamber, for example, having a diameter of about 80 cm and a height of about 60 cm. Such a volume is desirable for oxygen implantation of a workpiece such as a 300 mm (30 cm) semiconductor wafer. By having a diameter substantially larger than the workpiece diameter, plasma uniformity within the chamber will extend beyond the extent of the workpiece, thereby facilitating a high beam uniformity thereat. In addition, a large chamber volume advantageously aids in achieving a large $O_+/O_{2+}$ fraction, for example, greater than 98% when using the ion shower system for a SIMOX type process.

It was found that various wall reactions occur within the chamber 102, for example:

$O_+ \rightarrow O$,
$O_{2+} \rightarrow O_2$,
$2O \rightarrow O_2$.

Figure 4:
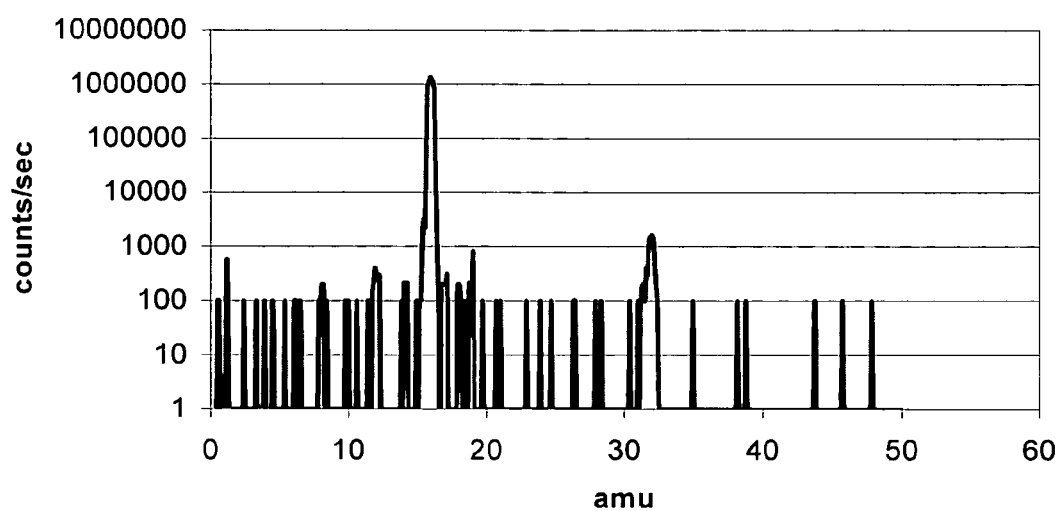
FIG. 4 is a graph illustrating an oxygen fraction obtained using the ion shower system of FIG. 3 in accordance with one aspect of the present invention.

In particular, the wall recombination ($2O \rightarrow O_2$) is particularly undesirable since such recombination negatively impacts (decreases) the $O_+/O_{2+}$ fraction. By having the large volume chamber 102, the volume to surface ratio is large and thus although surface recombination still occurs, such recombination is subsumed by the $O_+$ ions generated within the volume. Operating the above configuration at about 7.5 kW power and about 0.5 mTorr pressure, a plasma density of about $1 \times 10^{11}/cm^2$ is achieved with an $O_+/O_{2+}$ ratio substantially greater than 98%, as illustrated in FIG. 4.

The ion shower system 100 of FIG. 3 is not mass analyzed, thus the present invention contemplates coating the interior of the chamber 102 with silicon. Thus any "contamination" is silicon, and since the SIMOX process is performed into silicon, such contamination is permitted and is not a problem. The source interior, however, being silicon, will oxidize and become $SiO_2$ after exposure to oxygen plasma. $SiO_2$ is not a problem with respect to contamination in a SIMOX process, however, as the interior surface becomes an electrical insulator, the surface cannot be employed as a ground reference to the plasma. Consequently, as ions are extracted, no path exists for excess electrons, and thus the plasma will tend to float negative and at some point eventually prevent ion extraction toward the workpiece.

Therefore the ion shower system 100 of the present invention employs the grounding system 128 employing a plurality of grounding rods within the chamber 102. In one example, two silicon coated grounding rods 128 are employed, wherein the silicon coating is doped to make the rods more conductive. Preferably, the rods are doped with a P-type dopant such as Boron since semiconductor wafer starting material is typically a lightly doped P-type substrate.

In a preferred aspect of the present invention, one of the rods 128 is grounded and serves to collect excess electrons during ion extraction, while the second rod is biased negatively. Since the grounding rods 128 will tend to oxidize due to the presence of oxygen within the chamber 102, the negative bias will cause the biased rod to be sputtered clean by the plasma, thereby removing any oxide build-up thereon. Subsequently, the role of the rods is reversed, and the previously biased rod is grounded while the previously grounded rod becomes negatively biased. In the above manner the ground reference is maintained and such sputtering of the rods does not result in unacceptable contamination at the workpiece.

In accordance with one exemplary aspect of the present invention, a square wave voltage is applied to the two grounding rods 128, wherein the voltage to each is approximately 180 degrees out of phase with one another. In the above manner, at any instant, at least one of the grounding rods is grounded and acts to collect electrons during ion extraction while the other, negatively biased rod is being sputtered. Alternatively, a timing arrangement may vary, wherein at least one of the rods is grounded during the extraction process and any such variation is contemplated as falling within the scope of the present invention.

Figure 5:
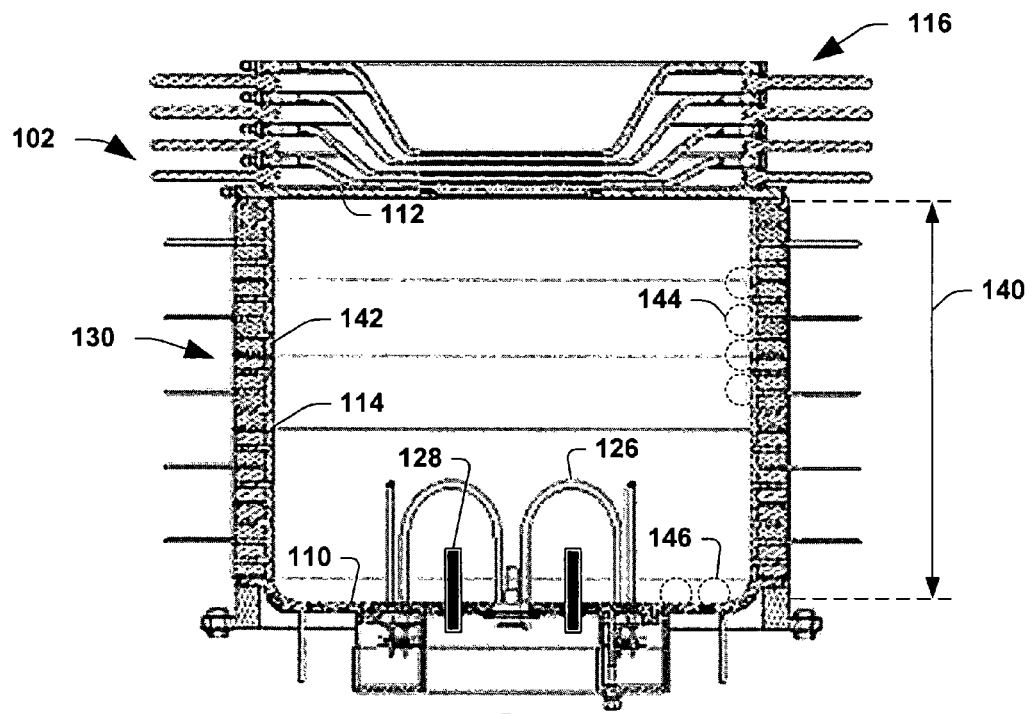
FIG. 5 is a side elevation view of a portion of the ion shower system of FIG. 3, illustrating in greater detail a chamber portion of various subsystems associated therewith.

Turning now to FIG. 5, the chamber 102 is illustrated in greater detail. As discussed above in conjunction with FIG. 3, the chamber 102 includes a plasma confinement system 130 along at least the side portion(s) 114 thereof. The plasma confinement system 130 is configured and adapted to provide containment of plasma along the periphery of the chamber. In one example where the chamber 102 is a cylinder, the system 130 operates to provide radial confinement along a vertical height 140 thereof. Such radial confinement may operate to advantageously facilitate azimuthal plasma uniformity within the chamber 102. In one example, the confinement system 130 operates to provide multi-cusp magnetic fields along the periphery or side portions 114 of the chamber 102. As may be appreciated, the multi-cusp magnetic field lines 144 operate to provide a substantial impedance to the plasma since the plasma tends to not cross the magnetic field lines. Thus the multi-cusp magnetic field lines extending into the chamber provide radial plasma containment and contribute to azimuthal plasma uniformity therein.

Any type of magnetic device may be employed to generate such fields, for example, an alternating pattern of permanent magnets having north and south poles that each encircle the chamber. Alternatively, and more preferably, the plasma confinement system 130 comprises a plurality of coils 142, wherein the coils are an alternating pattern encircling the chamber 102 such that neighboring coils have currents traveling in opposite directions (e.g., being oppositely wound), resulting in multi-cusp magnetic fields 144. In such an example, the coils each may be independently driven (drive circuit not shown), thereby advantageously providing tunability in the multi-cusp fields to maximize plasma uniformity within the chamber 102.

In addition, the plasma confinement system 130 may extend to the bottom portion 110 of the chamber 102, as illustrated in FIG. 5. In such a manner, the multi-cusp magnetic fields may extend up into the chamber interior from the bottom portion for improved plasma confinement and uniformity, as exemplified by the field lines 146. In one example, the plasma confinement system 130 on the bottom portion 110 of the chamber 102 comprises a plurality of permanent magnets have north and south poles associated therewith, wherein the magnets are arranged to facilitate plasma uniformity azimuthally, and any such arrangement is contemplated as falling within the scope of the present invention.

Figure 6:
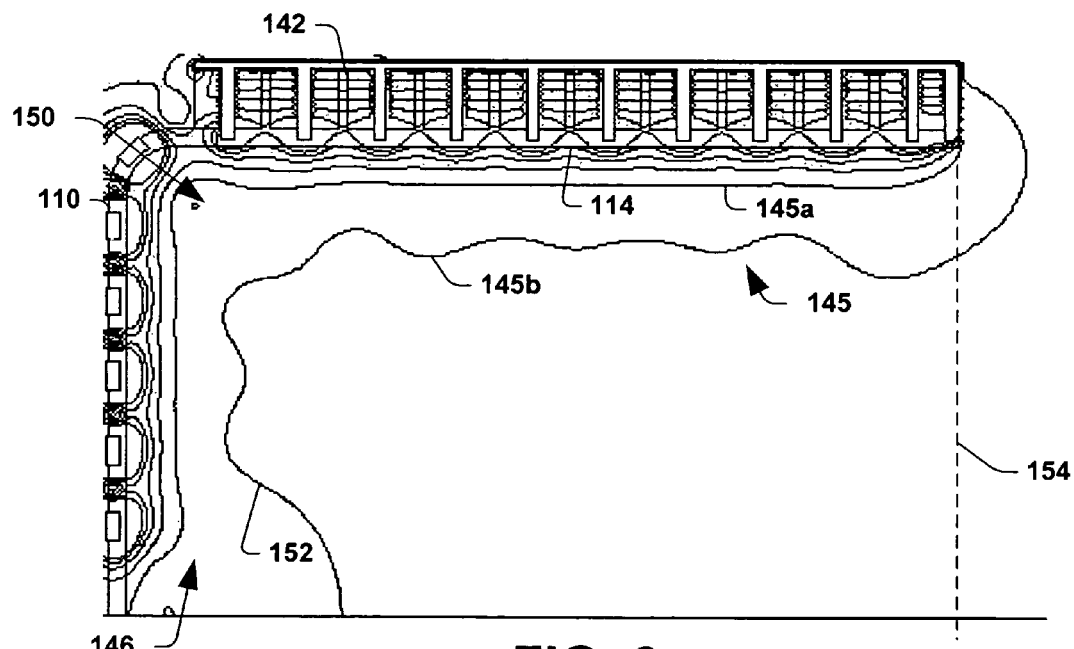
FIG. 6 is a sectional view illustrating a portion of the ion chamber having plasma flow lines associated therewith.

FIG. 6 illustrates exemplary plasma confinement within the chamber 102 employing the exemplary arrangement of FIG. 5. FIG. 6 illustrates contour lines representing regions of constant magnetic field magnitude within the chamber in cross section. Note that in FIG. 6, the side portion 114 of the chamber 102 has the multi-cusp magnets 142 that provide multi-cusp fields in a region 150 extending radially into the chamber. The magnetic field strength is illustrated by contour lines 145 of constant field magnitude, wherein close to the wall, 145a, the field is substantially high (e.g., about 1000 Gauss) whereas the field further in toward the chamber interior, 145b, is substantially lower (e.g., about 20 Gauss). Thus in the center of the chamber the plasma is free to move in a generally magnetic field free zone (e.g., magnetic field intensity is generally negligible). The multi-cusp fields aid in plasma containment, and in conjunction with the magnetic field free zones, facilitate plasma uniformity within the chamber. Such plasma uniformity advantageously results in beam uniformity at the workpiece (e.g., a beam current variation across a 300 mm wafer of less than 2%).

Figure 7:
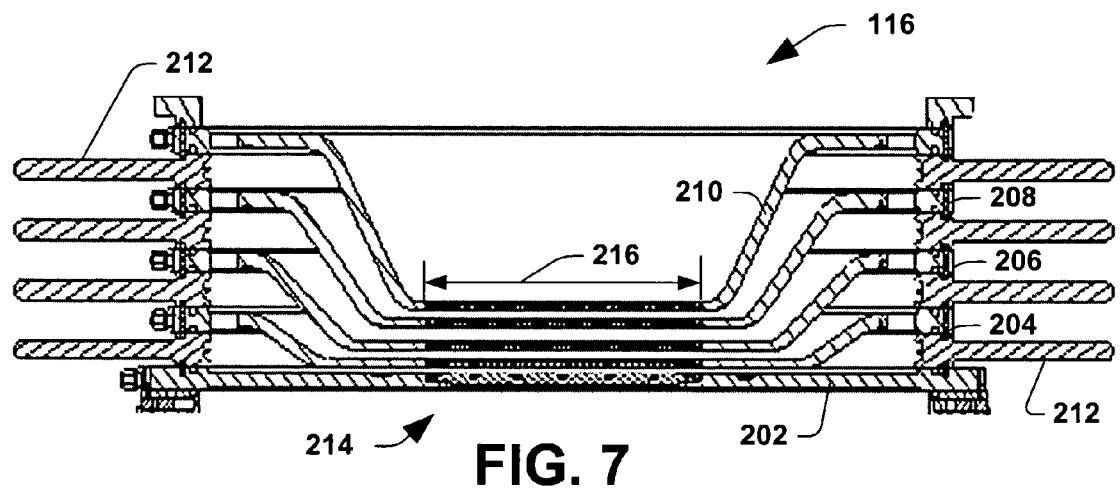
FIG. 7 is a side elevation view of an extraction assembly in accordance with one aspect of the present invention.

According to another aspect of the present invention, the extraction assembly 116 operates to extract oxygen ions from the chamber 102 and direct such ions toward a workpiece for implantation thereof at a given energy level. One exemplary extraction assembly of the present invention is illustrated in greater detail in FIG. 7, and comprises a pentode type electrode arrangement, wherein five electrodes 202-210 are aligned and spaced from one another via dielectric spacers 212. A first electrode 202 is the plasma electrode and contacts and attaches to the top surface 112 of the chamber 102. The plasma electrode 202 is biased with respect to the other electrodes 204-210, but floats with respect to the plasma (e.g., at 120 kV with respect to the workpiece that is typically grounded) within the chamber 102. Each of the electrodes 202-210 have an extraction region 214 through which a plurality of ion beamlets pass, and the extraction region has a diameter or size 216 that is at least as large as a diameter of the workpiece and is preferably larger in order to ensure beam uniformity thereat.

The second electrode 204 comprises the extraction electrode and is biased at a voltage less than that of the plasma electrode 202 (e.g., 105 kV). The negative relative potential with respect to the plasma creates an electrostatic field operable to extract positive ions (e.g., oxygen ions) out of the plasma chamber 102. The third, fourth and fifth electrodes 206, 208, and 210 comprise an auxiliary electrode, a suppression electrode, and a ground electrode, respectively. The ground electrode 210 is biased at the same voltage as the workpiece (e.g., 0V), while the suppression electrode 208 is biased at a voltage that is negative with respect to the ground electrode (e.g., −20 kV). The suppression electrode 208 operates to prevent electrons from a plasma local the workpiece (operating as an electron shower for charge neutralization at the workpiece) from entering the extraction assembly 116. The auxiliary electrode 206 operates to step down the voltage and is biased at an interim voltage (e.g., 40 kV) between the extraction electrode 204 and the suppression electrode 208, respectively.

Figure 8:
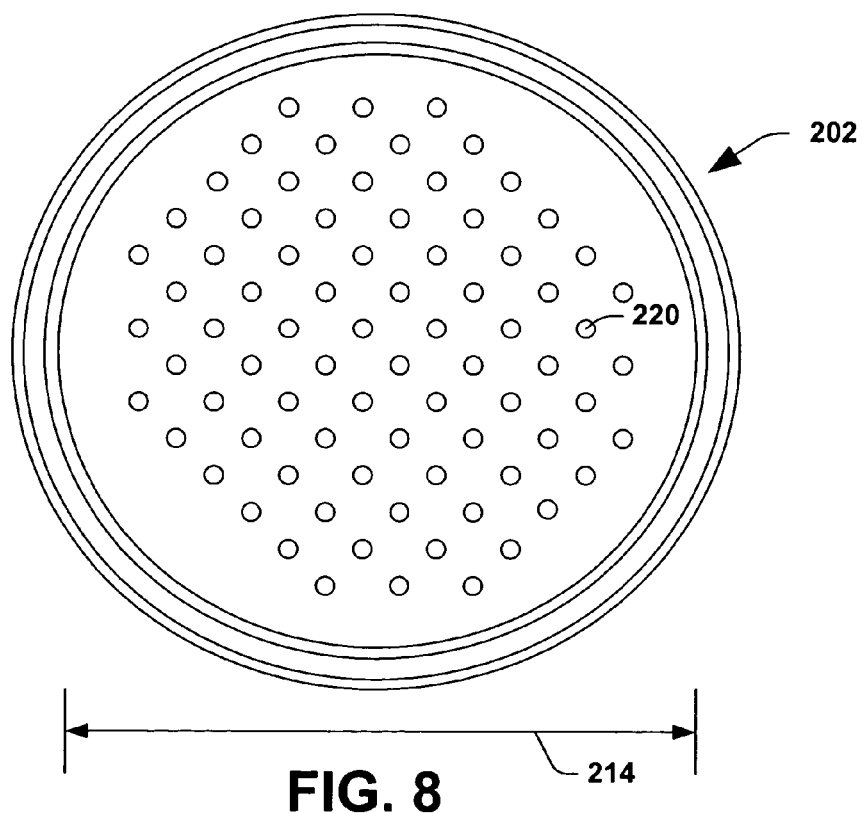
FIGS. 8-9 are plan views of a plasma electrode and an extraction electrode, wherein the plasma electrode has extraction apertures and the extraction electrode has extraction apertures and interstitial pumping apertures associated therewith.

The plasma electrode 202 has a plurality of extraction apertures associated therewith, as illustrated in FIG. 8 and designated at reference numeral 220. FIG. 8 is not drawn to scale, but rather is provided for purposes of illustration. The extraction apertures 220 are relatively small (e.g., about 3-4 mm in diameter), whereas the entire region diameter 214 is greater than 300 mm. The extraction aperture centers are spaced apart from one another (e.g., about 2 cm center-to-center), in a uniform manner, in one example, with spacing such that the electrode transparency is about 10%. Use of a high density plasma in the plasma chamber 102 permits the low transparency and also allows the plasma electrode 202 to be cooled via fluid ports/channels therethrough (not shown), if desired.

Alternatively, the extraction apertures may be spaced from one another in a non-uniform manner, with such non-uniformity configured to provide compensation for any non-uniformity in the plasma within the chamber 102. For example, if the plasma within the chamber 102 tends to "fall off" azimuthally, wherein a plasma density along an outer periphery region (that may correspond to the workpiece periphery) is about 5-10% less than a plasma density at the center, the density of extraction apertures 220 may be made greater along an outer periphery of the electrode 202 (and other electrodes). In the above manner, more ions are extracted along the outer periphery, leading to increased ion beam uniformity spatially at the workpiece. Any variation in extraction aperture configuration to compensate for plasma non-uniformities may be employed and is contemplated as falling within the scope of the present invention.

Figure 9:
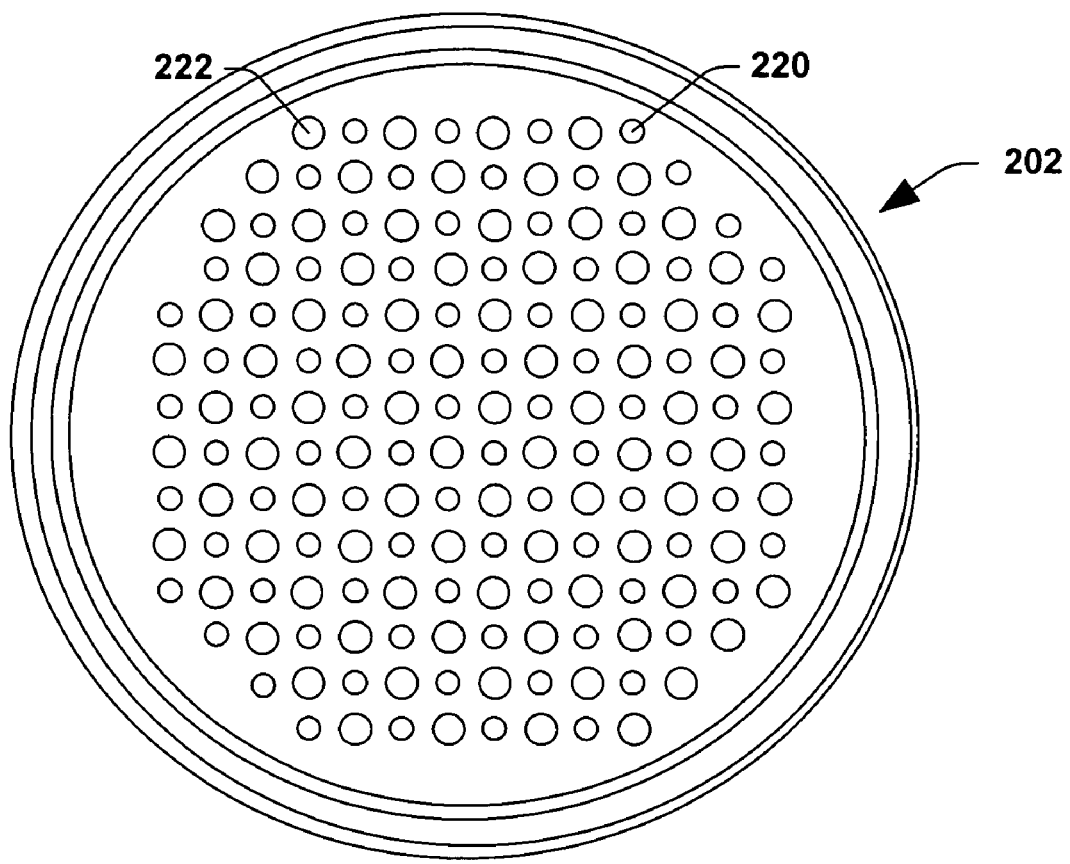

The extraction electrode 204 and other electrodes 206, 208 and 210 also have extraction apertures associated therewith that are aligned with respect to the extraction apertures 220 of the plasma electrode. In addition, the electrodes 204-210 have interstitial pumping apertures associated therewith, as illustrated in FIG. 9 and designated at reference numeral 222. As will be further appreciated below, the interstitial apertures 222 substantially improve extraction reliability by substantially reducing the pressure within the extraction assembly 116, thereby preventing discharges from undesirably shorting out the electrodes.

Figure 10:
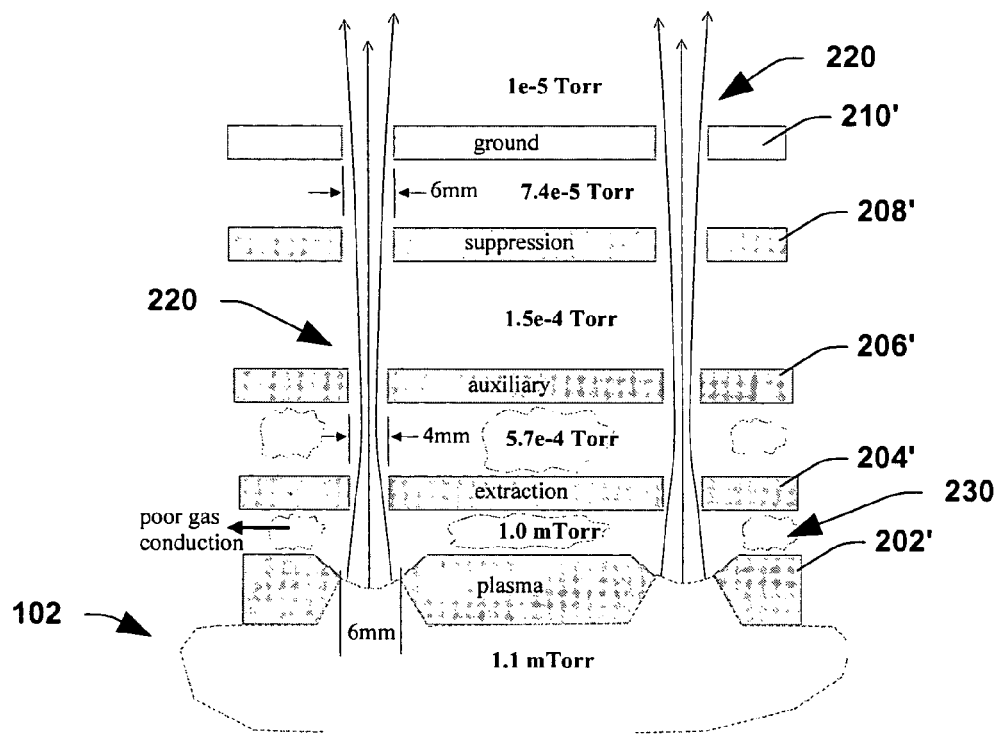
FIGS. 10-11 are fragmentary sectional views of extraction assemblies, wherein the assembly of FIG. 10 has extraction apertures and the assembly of FIG. 11 has both extraction apertures and interstitial pumping apertures associated therewith.

The inventors of the present invention identified that the high pressure within the chamber 102 could provide some operational disadvantages. For example, for a relatively high pressure in the chamber 102 (e.g., about 1 mTorr), a substantial amount of charge exchange occurs due to the ion beamlets colliding with neutral gas. Adding a pump in the workpiece chamber 118 operates to pump out the neutral gas passing through the extraction assembly 116 but not help substantially to reduce the pressure because transparency through an initial extraction assembly is low and gas conduction to the electrode sides is found to be relatively low, as illustrated in FIG. 10. In such an instance, the pressure differential between the chamber 102 and a region 230 between the electrodes 202' and 204' of FIG. 10 is relatively low (e.g., about 0.1 mTorr) which can disadvantageously result in discharges that can short out the extraction assembly.

Figure 11:
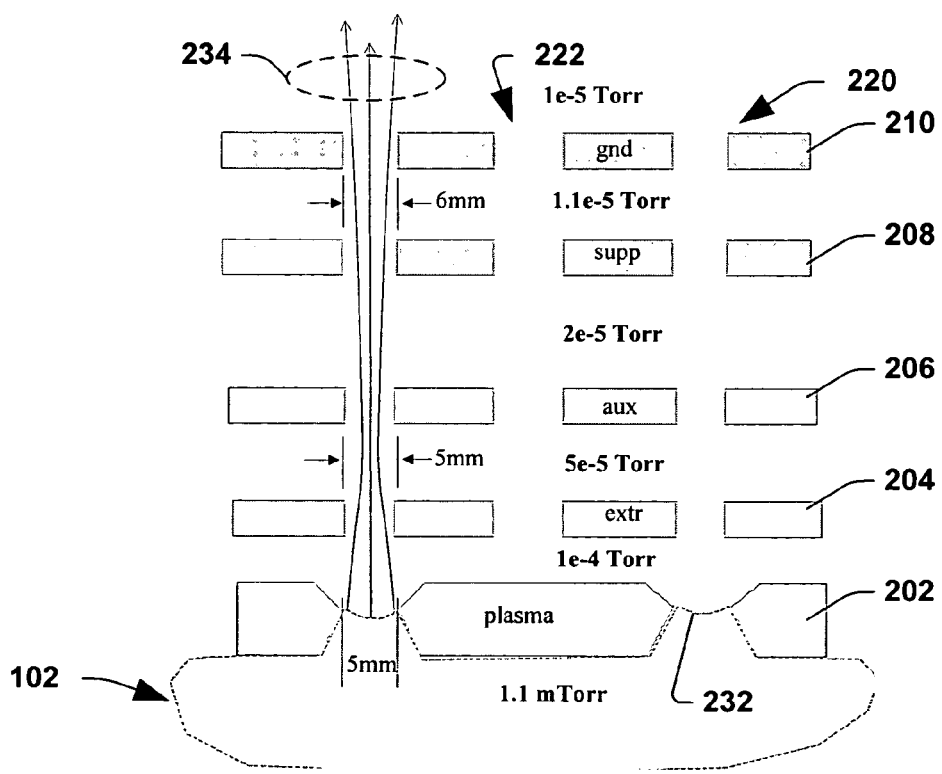

The electrodes 204-210 of the present invention employ the interstitial pumping apertures 222 in addition to the extraction apertures 220, as illustrated in FIGS. 9 and 11, that substantially lower the pressure in the extraction assembly (e.g., 1-2 orders of magnitude compared to the chamber pressure). Consequently, gas "constriction" exists at the plasma electrode 202, but substantial conductance is provided in the assembly 116 thereafter due to the pump 122 in the workpiece chamber 118 removing the neutral gas passing through the interstitial pumping apertures 222.

As illustrated in FIG. 11, the interstitial pumping apertures 222 are not aligned with the extraction apertures 220. Thus, the oxygen beamlets 234 still are extracted through the extraction apertures 220 without being impacted, while the interstitial pumping apertures 222 readily allow a plurality of neutral gas conducting paths through the assembly 116. Pumping of such neutral gas through the extraction assembly 116 is important to keep the pressure within the plasma chamber 102 from getting too high and creating discharges. Although the interstitial pumping apertures 222 in FIG. 11 are illustrated as being aligned with respect to one another, alternatively, such apertures may be staggered with respect to one another and such a variation is contemplated as falling within the scope of the present invention.

In addition, it should be noted that the extraction assembly can be configured in a variety of ways to regulate an amount of ion beamlet overlap at the workpiece to adjust an amount of beam uniformity thereat. For example, as illustrated in FIG. 11, a potential difference between the plasma electrode 202 and the extraction electrode 204 creates an electrostatic field that pushes electrons in the plasma chamber 102 away from the extraction apertures 220 in the plasma electrode 202, resulting in a plasma sheath 232 that appears like an inverted meniscus. The magnitude of the voltage difference dictates the magnitude of the electrostatic field, thereby impacting a shape of the plasma sheath. The sheath 232 acts as a lens for the ion beamlets 234, thereby affecting a focus of each of the beamlets. As illustrated in FIG. 11, the plasma sheath 232 impacts a focusing of the beamlets, thereby allowing the extraction apertures 220 of each of the electrodes (although still aligned) to be uniquely sized so as to pass the ion beamlets while concurrently blocking contaminants.

The beamlets 234 exit the last electrode (the ground electrode 210), and due to the plasma sheath optics, each of the beamlets is slightly diverging. The workpiece (not shown) is spaced away from the ground electrode 210 a predetermined distance such that the beamlets 234 overlap at the workpiece surface for beam uniformity thereat. In SIMOX type processing, it is desirable to obtain an oxygen ion beam uniformity of <1% variation at the workpiece. The inventors of the present invention have determined that such uniformity may be obtained if at least three (3) beamlets 234 overlap at the workpiece surface. That is, a predetermined distance is provided (in accordance with the plasma sheath 234) such that an edge of one beamlet touches a beamlet center at least two beamlets away.

Figure 12:
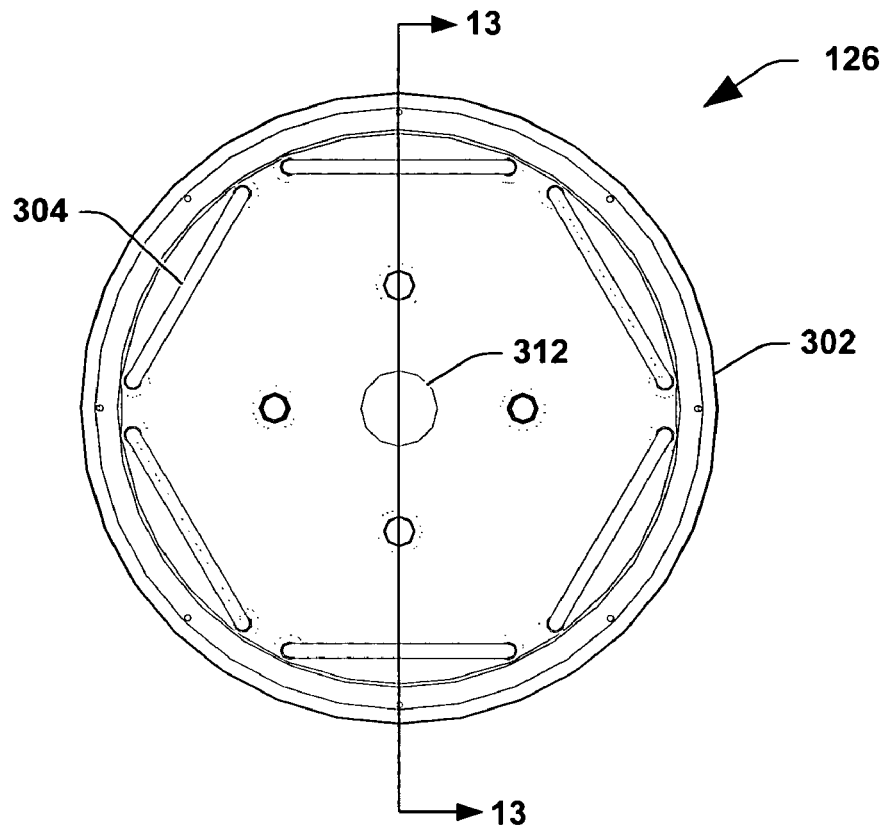
FIG. 12 is a plan view of an antenna assembly employed for generating a plasma in the ion shower system of FIG. 3 in accordance with another aspect of the present invention.
Figure 13:
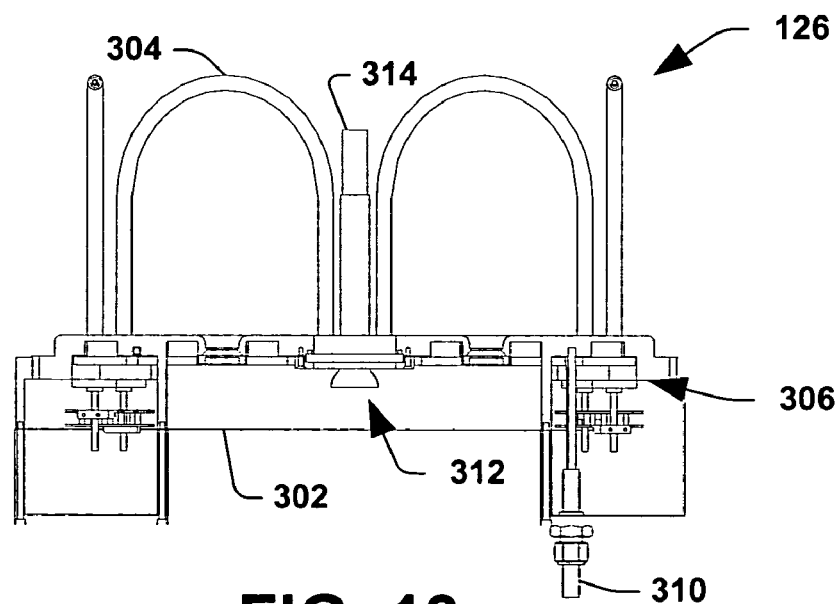
FIG. 13 is a side elevation view taken along line 13-13 of FIG. 12 illustrating the antenna assembly of the present invention.
Figure 14:
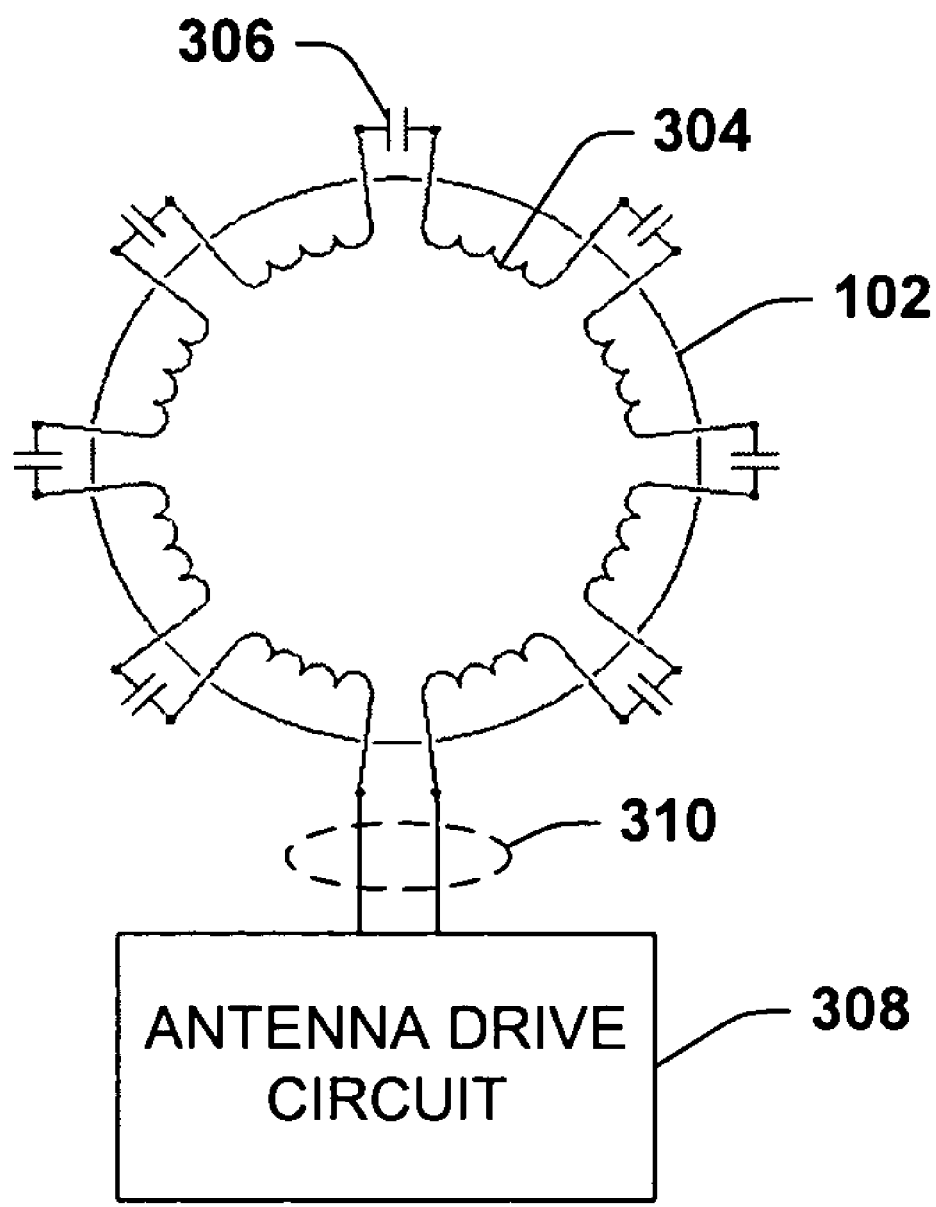
FIG. 14 is an exemplary schematic diagram illustrating an antenna assembly similar to that of FIGS. 12 and 13, according to an aspect of the present invention.

Turning now to another aspect of the present invention, the antenna system 126 will be described in conjunction with FIGS. 12-14. FIG. 12 illustrates a plan view of the antenna system 126 taken from a position inside the plasma source chamber 102 of FIG. 3, while FIG. 13 is a side elevation view taken along line 13-13 of FIG. 12. And lastly, FIG. 14 is a schematic diagram illustrating an effective electrical circuit of the antenna system 126 of FIGS. 12-13.

Referring to FIGS. 12 and 13, the antenna system 126 comprises a base 302, for example, associated with a bottom portion 110 of the chamber 102 upon which a plurality of antenna conductors 304 reside. The antenna conductors 304 are serially coupled together through capacitors 306 associated with the base 302, and two of the conductors are coupled externally to an antenna drive circuit 308 (FIG. 14), through an RF coupling mechanism 310. In addition, the base 302 has an aperture 312 within a central portion thereof, wherein an inlet source gas feed 314 extends therethrough to form a portion of the inlet gas feed port 124 of FIG. 3. The inlet source gas fed 314 provides a neutral gas (e.g., oxygen) in the chamber 102 for ionization thereof to form a plasma, as will be discussed further below.

In accordance with one aspect of the present invention, the antenna drive circuit may comprise an integrated power oscillator RF source such as that described in U.S. Pat. No. 6,305,316 and assigned to the assignee of the present invention, which is hereby incorporated by reference in its entirety. In such an example, the integrated power oscillator employs characteristics of the RF segmented antenna within the oscillator tank circuit. Such incorporation advantageously facilitates high-speed ignition of the plasma that is important, in some cases, because when the system is activated the ion beam is immediately striking the workpiece and no time exists for a manual tuning of the tank circuit. The integrated power oscillator advantageously automatically adapts to the change in the plasma impedance during plasma ignition.

The antenna conductors 304 are arranged in an azimuthally symmetric fashion about the base 302 as illustrated in order to generate an azimuthally symmetric plasma within the chamber 102. Such uniformity of the plasma operates to provide advantageously a uniform beam current at the workpiece. Although six conductors 304 are illustrated in FIG. 12, it should be understood that any number "N" of such conductors may be employed and such variations are contemplated by the present invention, wherein "N" is an integer greater than 1. The antenna system 126 of the present invention generates a plasma via inductive coupling, and the arrangement provides a substantial reduction in variation along the antenna elements compared to conventional arrangements without a need for a faraday shield.

The RF antenna system 126 of the present invention operates in the following manner. A time dependent current is generated in the conductors 304 via the antenna drive circuit 308. The time-varying current produces a magnetic field that surrounds the conductive elements in accordance with Faraday's law. Because the current is time-varying, the produced magnetic field is a time-varying field. In accordance with Maxwell's equations, the time-varying magnetic field induces a time-varying electric field normal thereto, wherein the time-varying electric field extends along a direction of the conductors 304 and decays as the field extends away therefrom. This time-varying electric field is referred to as the inductive electric field component since it is induced from the time-varying magnetic field.

The time-varying inductive electric field accelerates charged particles such as electrons near the antenna conductors 304. Further, the antenna elements are configured such that the velocity of the accelerated charged particles is sufficient so that the charged particles move through the region associated with a conductor in a time that is short compared to the period (T) of the time-varying current. Consequently, the charged particles see a substantially steady field as it travels along the conductor 304. Therefore the time-varying electric field "heats" the charged particles that then have sufficient energy to ionize the source gas atoms within the chamber 102 upon collision therewith. The ionizing collisions operate to generate the plasma and such plasma generation is substantially azimuthally symmetric in accordance with the configuration of conductors 304 about the base 302.

In addition, the current generated and flowing through the conductors is produced by an RF voltage (e.g., 800V peak to peak). Therefore the conductor elements 304 have a voltage across each element that spatially varies along a length of the element. Consequently, the varying charge distribution along an element 304 produces an electrostatic field that extends from the conductors outwardly and the strength of the field varies spatially along the length of the element. This electrostatic field component is referred to as the capacitive field component. Because this field is not uniform, the contribution of this field component to plasma generation is non-uniform, and thus it is desirable for this electric field component to be reduced as much as possible.

Some conventional antenna designs employ a faraday shield to block or minimize the capacitive field component. In such a solution, the faraday shield is placed between the conductors and the plasma, however, such a solution increases circuit losses and is practically difficult to configure since the conductors in the present system are immersed in the plasma. The antenna system 126 of the present invention overcomes the disadvantages of the prior art and provides a structure that substantially reduces the capacitive field contribution of the system without use of a faraday shield, as will be further appreciated below.

The antenna design 126 of the present invention divides what conventionally was a single conductor into "N" conductor segments 304 (e.g., N=6 as illustrated in FIG. 12, or N=8 as illustrated in FIG. 14), wherein each conductor segment 304 is DC-isolated from one another, but in RF-series via capacitors 306. Such an arrangement reduces the peak capacitive electric field component by a factor of N. Referring to FIG. 14, preferably the values of L (associated with the conductors 304), C (the capacitors), and f (the frequency of the drive signal from the antenna drive circuit 308) are selected so that the magnitude of the reactance of the inductive component ($2\pi fL$) is equal to the magnitude of the reactance of the capacitive component ($1/2\pi fC$). In the above manner, a resonant circuit exists, in which the voltage drop across each inductive element L is equal and opposite to the voltage drop across each capacitive element C. Thus, the maximum voltage drop is reduced by a factor of "N" compared to the case of N inductive elements in series without capacitive elements. Also, although some variation still occurs along a length of an individual component 304, it is N times smaller than a conventional arrangement, and as illustrated in FIG. 12, such variation is itself azimuthally symmetric due to the arrangement of the conductors azimuthally.

The antenna system 126 thus operates to generate a plasma within the chamber 102, wherein the generated plasma is azimuthally symmetric. The azimuthal symmetry of the plasma advantageously helps to provide a spatially uniform beam current at the workpiece.

Although the invention has been illustrated and described above with respect to a certain aspects and implementations, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (i.e., that is functionally equivalent), even though not structurally equivalent to the disclosed structure, which performs the function in the herein illustrated exemplary implementations of the invention. In this regard, it will also be recognized that the invention may include a computer-readable medium having computer-executable instructions for performing the steps of the various methods of the invention. In addition, while a particular feature of the invention may have been disclosed with respect to only one of several implementations, such feature may be combined with one or more other features of the other implementations as may be desired and advantageous for any given or particular application. In accordance with the present invention, the term "ribbon-like" should be understood to include both a ribbon beam and a scanned pencil type beam. Furthermore, to the extent that the terms "includes", "including", "has", "having", "with" and variants thereof are used in either the detailed description or the claims, these terms are intended to be inclusive in a manner similar to the term "comprising". Also, the term "exemplary" as utilized herein simply means example, rather than finest performer.

What is claimed is:

1. An ion shower system, comprising:
   a plasma source operable to generate source gas ions within a chamber, wherein the plasma source further comprises:
   a plurality of conductor segments;
   a plurality of capacitors, wherein the conductor segments are serially connected through the plurality of capacitors, wherein the series arrangement of conductor segments and capacitors reside within the chamber;
   an antenna drive circuit coupled to the plurality of conductor segments, and operable to provide power to the conductor segments and capacitors at a predetermined frequency; and
   a source gas inlet,
   wherein the source gas inlet is operable to provide a source gas to the chamber, and wherein the conductor segments, capacitors and antenna drive circuit cooperatively provide energy to charged particles in the chamber, thereby energizing the charged particles and generating a plasma comprising source gas ions and electrons within the chamber due to ionizing collisions between the energized charged particles and the source gas;
   an extraction assembly associated with the chamber, and operable to extract source gas ions therefrom.

2. The ion shower system of claim 1, further comprising a workpiece support structure associated with the chamber, and operable to secure the workpiece for implantation thereof of source gas ions from the extraction assembly.

3. The ion shower system of claim 1, wherein first and last conductor segments of the plurality of conductor segments form an input, and Wherein the antenna drive circuit is coupled to the input.

4. The ion showers system of claim 1, wherein the conductor segments have an inductive reactance associated therewith, and wherein the capacitors have a capacitive reactance associated therewith, and wherein one of the conductors and one of the capacitors form an antenna segment, wherein the inductive reactance and capacitive reactance of the antenna segment are equal at the predetermined frequency.

5. The ion shower stem of claim 1, wherein the plurality of conductor segments and plurality of capacitors form a resonant circuit at the predetermined frequency.

6. The ion shower system of claim 1, wherein the antenna, drive circuit comprises an oscillator circuit.

7. The ion shower system of claim 1, wherein the plurality of conductor segments and capacitors are arranged within the chamber in an azimuthally symmetric fashion, wherein a non-uniform capacitive electrostatic field component along each conductor segment is repeated in an azimuthally symmetric fashion.

8. The ion shower system of claim 1, wherein the extraction assembly is associated with a top portion of the chamber; and is operable to extract ions vertically from the top portion thereof.

9. The ion shower system of claim 8, further comprising a workpiece support structure associated with the top portion of the chamber, and operable to secure the workpiece having an implantation surface orientated facing downward toward the extraction assembly for implantation thereof.

10. The ion shower system of claim 1, wherein the chamber further comprises a bottom portion and side portions, and wherein the side portions comprise a plurality of multi-cusp magnet devices operable to produce multi-cusp magnetic fields thereat to facilitate an azimuthal uniformity of plasma within the chamber.

11. The ion shower system of claim 10, wherein the multi-cusp magnet devices comprise electromagnets operable to provide a variation in multi-cusp magnetic field strength at differing positions along the side portions.

12. The ion shower system of claim 11, wherein the electromagnets are independently controllable, thereby facilitating a tuning of the multi-cusp magnetic fields.

* * * * *